United States Patent [19]

Pelts et al.

[11] 4,416,723
[45] Nov. 22, 1983

[54] METHOD FOR PRODUCING SAPPHIRE TUBES

[76] Inventors: Boris B. Pelts, Lesnaya ulitsa, 63/43, kv. 157, Moscow; Beniamin A. Tumasian, prospekt Lenina, 39/12, kv. 51, Erevan; Leonid P. Egorov, Profsojuznaya ulitsa, 87, korpus 1, kv. 92, Moscow; Lev M. Zatulovsky, Orlikov pereulok, 8, kv. 55, Moscow; Peter M. Chaikin, , Staroslobodsky pereulok, 14, kv. 18, Moscow; Efim A. Freiman, 2 Vladimirskaya ulitsa, 15, korpus 1, kv. 53, Moscow; Eduard A. Chalian, ulitsa Gvardeiskaya, 9, kv. 30, Erevan; Grant I. Abramian, ulitsa Olega Koshevogo, 26, kv. 3, Erevan; Stepan E. Azoian, 7 ulitsa Agesan, 17, Erevan; Kliment A. Kostandian, 10 ulitsa Zeituna, 10, kv. 5, Erevan, all of U.S.S.R.

[21] Appl. No.: 337,739

[22] Filed: Jan. 7, 1982

Related U.S. Application Data

[60] Division of Ser. No. 205,985, Nov. 12, 1980, Pat. No. 4,325,917, which is a continuation of Ser. No. 926,492, Jul. 20, 1978, abandoned.

[30] Foreign Application Priority Data

Jul. 21, 1977 [SU] U.S.S.R. .............................. 2509201

[51] Int. Cl.³ .............................................. B01J 17/18
[52] U.S. Cl. .............................. 156/608; 156/617 SP; 156/619; 156/DIG. 61; 156/DIG. 64; 156/DIG. 73
[58] Field of Search .................. 422/249, 248; 106/42; 156/608, 617 SP, 619, DIG. 64, DIG. 73, DIG. 89, DIG. 61

[56] References Cited

U.S. PATENT DOCUMENTS 3,953,174 4/1976 LaBelle ......................... 156/617 SP
4,184,907 1/1980 Yates ............................. 156/617 SP

*Primary Examiner*—Frank Sever
*Attorney, Agent, or Firm*—Fleit, Jacobson, Cohn & Price

[57] ABSTRACT

During the process of pulling sapphire tubes from a melt with the aid of a seed, the longitudinal temperature gradient in the zone between the solidified front and the region of pulling where the temperature is between 1850 and 1900 deg. C. is maintained not in excess of 30 deg. C./cm. The tube so grown is annealed at a temperature between 1950 and 2000 deg. C. by increasing the temperature at a rate of 30 to 40 deg. C./min and keeping the tube at said temperature during a period between 3 and 4 hours. After that the tube is cooled down to room temperature at a rate of 30–40 deg. C./min.

Disclosed is also an apparatus which enables said temperature gradient to be maintained while pulling the tube.

9 Claims, 2 Drawing Figures

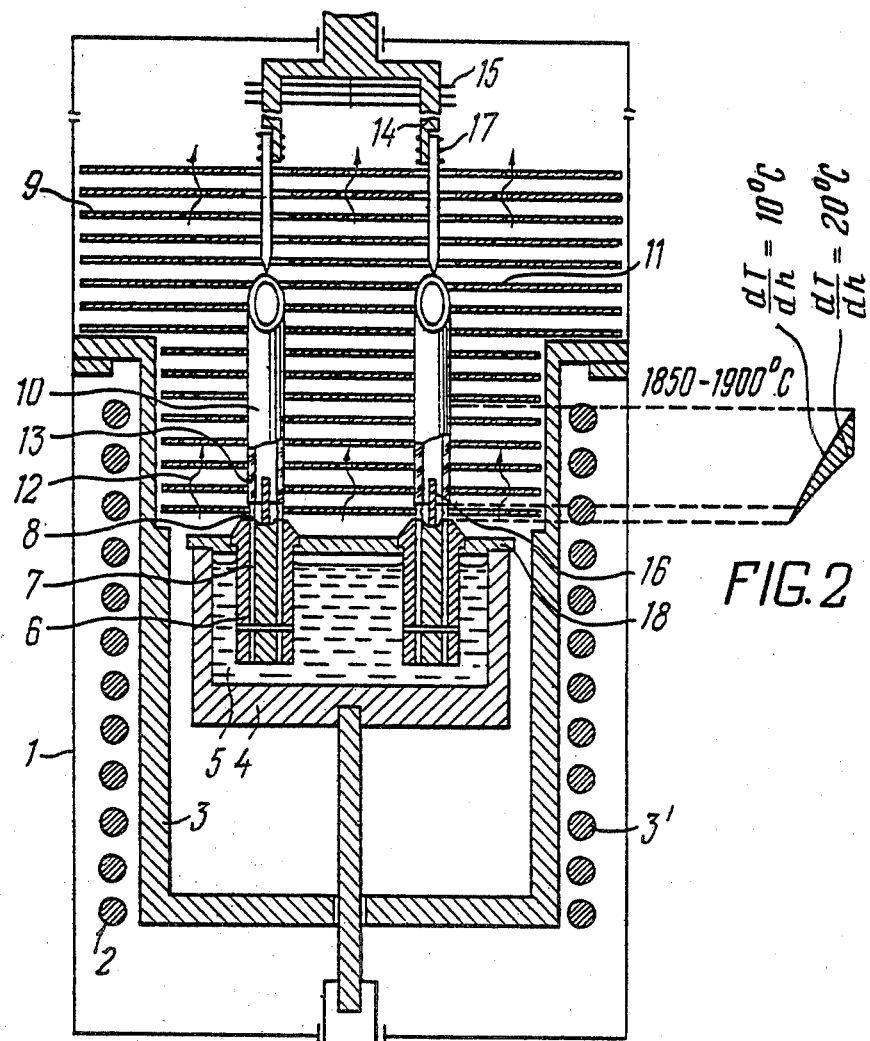

METHOD FOR PRODUCING SAPPHIRE TUBES

This is a divisional of application Ser. No. 205,985, filed Nov. 12, 1980, now U.S. Pat. No. 4,325,917, which in turn is a continuation of application Ser. No. 926,492, filed July 20, 1978, now abandoned.

FIELD OF THE INVENTION

The present invention relates to the manufacture of materials by pulling from a melt, and more specifically, to a method of producing crystalline sapphire tubes and an apparatus realizing same.

BACKGROUND OF THE INVENTION

There are known various methods of growing sapphire tubes by pulling a pin-shaped seed from a molten annular film formed at an end face of a die wherein said film continuously receives a supply of melt through capillary tubes in the die contained in a crucible. Yet, among the problems encountered in growing tubes there is one of impaired mechanical strength and transparency brought about by peculiarities in the distribution of temperatures in the tube grown. The point is that elastic temperature strains coming into play in a tubular sapphire crystal give rise to dislocations, block-like structure and impair the mechanical strength of the crystal after all.

The method referred to above has been embodied in an apparatus incorporating an air-tight chamber with an induction heater for the indirect heating made in the form of a conductive cylindrical container with the working coil wound around same. Disposed in the container bore is a crucible with dies located below the upper edge of the container which is provided with horizontal heart-insulating shields arranged in the bore of said container above the crucible and pierced with perforations enabling the tube or tubes pulled to pass therethrough. Inherent in the known apparatus are the same drawbacks as present in the above method which originate from the failure to take into account the distribution of temperatures in the tube pulled. Another disadvantage calling for attention is that in the known apparatus the phenomenon of overheating of the crucible is likely to be observed with the result that gas bubbles are formed which make their way into the liquid film and thence into the crystal grown, reducing thus its mechanical strength. The effect of said disadvantages inherent in the method and apparatus known is especially felt in growing thin-walled sapphire tubes.

SUMMARY OF THE INVENTION

It is an object of the present invention to provide a method of producing crystalline sapphire tubes which will assure high mechanical strength and good transparency thereof.

It is a further object of the present invention to provide a method of producing sapphire tubes which will create the prospect of growing thin-walled sapphire tubes displaying high mechanical strength.

It is yet another object of the present invention to provide a method of pulling sapphire tubes which have an essentially single crystal structure free of dislocations and "blocks".

It is also an object of the present invention to provide an apparatus for producing crystalline sapphire tubes which maintains temperatures during the process of pulling conductive to high mechanical strength and good transparency.

Said and other objects are attained by the fact that in producing crystalline sapphire tubes by pulling from a melt with the aid of a seed through a melt-wetted die under an inert-gas blanket, according to the invention, inside a zone between the solidified front and the region of pulling wherein the temperature is 1850 to 1900 deg. C. the temperature gradient in the wall of the tube pulled is maintained not in excess of 30 deg. C./cm and the tube grown is annealed at a temperature between 1950 and 2000 deg. C. by being heated at a rate of 30–40 deg. C./min and cooled to the requisite temperature at a rate of 30–40 deg. C./min.

The advantage of the method disclosed consists in that sapphire tubes are pulled under temperature conditions which prevent the tube grown from a state of stress leading to dislocations and block-like structure, providing for high strength characteristics and good light transmission at the same time. The operating temperatures are to be kept within a relatively narrow range because outside this range the mechanical and optical properties of the tubes sharply deteriorate. The best results are obtainable if said temperature gradient is between 10 and 20 deg. C./cm. The period of annealing must be anywhere between 3 and 4 hours.

The method disclosed can be realized by means of an apparatus incorporating an induction heater for the indirect heating in the form of a working coil wound around a conducting cylindrical container disposed in an air-tight chamber so that a crucible with the die is located below the upper edge of said container accommodating a stack of horizontal heat-insulating shields provided with perforations enabling the tube pulled to pass therethrough wherein in accordance with the invention the length of the cylindrical container extending above the crucible is roughly equal to the height of the crucible and the side wall of said length is made thinner than elsewhere so that the shields in a conductive material are disposed in the electromagnetic field of the induction heater and additional heat-insulating shields are arranged above the upper edge of the container so as to maintain in conjunction with said shields the specified temperature gradient within the region of pulling the tube while a pin of a heat-conducting material with a melting point exceeding 2100 deg. C. is provided at the top of the die coaxially with same.

The apparatus disclosed provides for the distribution of temperatures in the way envisaged by the method disclosed, being consequently conducive to the production of sapphire tubes displaying high mechanical strength.

Still better temperature conditions can be created if the shields are provided with additional perforations enabling the convective gas flows to pass, these perforations being located in the central portion and around the periphery of the shields and having each a cross-sectional are which exceeds the cross-sectional area of a gap between the tube and the edges of the perforations forming the passage in the shields for pulling same. It is expedient that said holes are located in the adjacent shields other than coaxially so that the passage formed is a twisting one.

BRIEF DESCRIPTION OF THE DRAWINGS

An apparatus whereby the realization of the method disclosed can be obtained will now be described by way of an example with reference to the accompanying drawings in which FIG. 1 illustrates a sectional elevation of the apparatus carrying into practice the method disclosed, and FIG. 2 is a diagram showing the distribution of temperatures in a length of the tube between the solidified front and a cross section of the tube where the temperature is 1850 to 1900 deg. C.

DESCRIPTION OF THE PREFERRED EMBODIMENT

In considering the construction of the apparatus disclosed with reference to FIG. 1 it is assumed that the essence of the method also disclosed herein will be best understood from the description which follows and the example concluding it.

The apparatus of FIG. 1 is essentially an air-tight chamber 1 contained wherein is an induction heater 2 for the indirect heating formed by a cylindrical container 3 and a working coil 3'. A crucible 4 containing a melt 5 and fitted with dies 6 is located in the bore of the container 3. The dies 6 are provided each with capillary feeding passages 7 and annular edges 8 at the top. The height of the container 3 is at least three times the height of the crucible 4, and the distance from the bottom of the container is equal to at least the height of the crucible 4. That length of the container which extends above the crucible is made somewhat thinner than elsewhere, the wall thickness within said length being between $\frac{1}{4}$ and $\frac{1}{2}$ of the depth $\Delta$, of penetration of the induced current into the material of the container which can be calculated from the formula $$\Delta = 5030 \sqrt{\frac{\rho}{f}} \text{ cm,}$$

where
- $\rho$ = resistivity of the material of the container, ohm.cm;
- f = frequency of the current flowing through the heater, Hz.

The height of the thinner portion is roughly equal to the height of the crucible.

At the top of the crucible is an immovable stack of sixteen horizontal shields 9 of which the eight shields in the lower portion of the stack are in a conductive material and are arranged in that portion of the container where the sidewalls are thinner than elsewhere. Since the reduced thickness of the sidewall of the container 3 within said portion is rather small, being between $\frac{1}{4}$ and $\frac{1}{2}$ of $\Delta$, said shields are heated directly by the current induced therein to a temperature which is higher than that of what is called "passive" shields. The shields 9 are pierced with perforations 11 enabling convective gas flows 12 to pass, said perforations being arranged in the central portion of the shields and at their periphery in a pattern which is other than the coaxial one in the direction of the height of the stack. The perforations 11 improve the distribution of temperatures in tubes 10 pulled to a considerable extent and contribute to a decrease in the number of particles settled from the gas flows on the tubes. To render said redistribution of the gas flows as effective as possible, the area of ech perforation in the shields should be equal to at least the area of a gap between the shields and the tubes pulled. The non-coaxial pattern of the perforations in the adjacent shields pointed out above provides for adequate heat-insulating properties of the stack of shields in the zone of said perforations.

Since sapphire possesses good optical properties, the tube grown is a perfect light pipe which caters for intensive removal of heat upwards from the solidified front 13 by irradiation. To reduce the amount of heat radiating upwards and reduce thereby the longitudinal temperature gradient in the tube pulled, at least three shields 15 are rigidly attached to seed chucks 14. A further reduction of the longitudinal temperature gradient in the tube next to the solidified front is achieved by providing pins 16 attached to the end faces of the dies and protruding beyond the annular edges thereof by an amount equal to at least the inside diameter of said edges. Said pins are made of a heat-conducting material with a melting point above 2100 deg. C. To prevent any possible displacement of the sapphire seed with respect to the pull shaft in the course of pulling the tube, the seed chuck components such as, for example, a clamping wire 17 are made of niobium which has a coefficient of thermal expansion approaching that of sapphire.

The apparatus disclosed operates on the following lines which provide an explanation to the essence of the method disclosed.

Starting material which is aluminium oxide is loaded into the crucible 4 through the holes in a molybdenum cover plate 18, and the stack of horizontal shields 9 is put into its place. On closing the chamber air-tight fashion and evacuating same to a pressure of $10^{-5}$ mm Hg, the crucible 4 is heated to a temperature around 1700 deg. C. by increasing the voltage applied to the working coil 2. Said temperature is maintained for a period of 40 min and then the chamber is filled with an inert gas, e.g. argon, under an excess pressure vetween 0.1 and 0.3 atm. gauge. Giving the voltage applied to the induction heater a further increase, the aluminium oxide contained in the crucible 4 is turned into the melt 5 which rises to the annular edges 8 at the top of each die 6 through the capillary tubular passages 7 provided therein. Next, the sapphire seeds are lowered into contact with the edges 8 so that the melting of the seed tips occurs while a thin film of the melt (0.2 or 0.3 mm) is formed at the edges of the dies under the seeds. Pulling now the seeds by any of the known techniques at rates and temperatures changing in accordance with a program, each of the crystals 10 is being grown downwards from the rod-shaped seed until the solidified front and, consequently, the film of the melt at the edge of each die turns into a closed ring. At this moment the crystal grown gets a tubular shape and a point to be noted is that the use of tubular seeds is also a practical possibility.

During the process of pulling, a longitudinal temperature gradient of 30 deg. C./cm or somewhat less must be maintained in the wall of the tube grown between the solidified front and a cross section of the tube where the temperature is 1850 to 1900 deg C. Any increase in the temperature gradient beyond 30 deg. C./cm noticeably impairs the structure of the crystal and, apart from that, appreciably increases both the density of an opaque layer coating the wall of the tube and the number of bubbles appearing in the tube. Yet, too low temperature gradients appear to be impractical for it has been proved that they improve neither the structure nor the transparency of the tube while decreasing the capacity of the process. What should be kept in mind and is an important aspect of the present invention is the necessity to maintain the temperature gradient within said limits in that zone of the tube which is heated above the critical temperature of 1850 to 1900 deg. C.

The distribution of temperatures over the length of the tube pulled as envisaged by the present invention is shown in FIG. 2 wherein the area hatched denotes the allowable region of temperature changes, the distance between the two continuous lines indicates the column of the melt and the upper line corresponds to the solidified front. This allowable range of temperature changes according to FIG. 2 is maintained as specified by means of the apparatus disclosed wherein appropriate changes in the voltage applied to the induction heater are made to that end.

On completing the process of pulling, the tubes are torn off the melt by sharply increasing the rate of pulling the seeds, alternatively the crucible can be lowered integrally with the dies. The crystalline tubes pulled are subjected to annealing by being heated to between 1950 and 2000 deg. C. at a rate of 30 to 40 deg. C./min, kept at said temperature for a period of between 3 and 4 hours, and cooled at a rate of also 30 to 40 deg. C./min. Said conditions of annealing are in agreement with the temperatures under which the process of pulling has taken place and are regarded as optimal; any deviation from the above conditions towards an increase in the temperature or the period of annealing substantially reduces the capacity of the process while a decrease in the temperature and annealing period causes an, incomplete relaxation of stresses in the tube.

Sapphire tubes were grown in accordance with the method disclosed (Example 2) and disregarding the temperature conditions (Example 1).

EXAMPLE 1.

A sapphire tube 9 mm in diameter and with a wall thickness of 0.75 mm was grown under the conditions of a longitudinal temperature gradient of 38 deg. C./cm in the wall, using an apparatus where the shields above the crucible lacked the perforations for the passage of convective gas flows. The subsequent annealing was omitted. The sapphire tube so produced showed an integrated light transmission of 85.5 percent. During a performance test, a 400-W high-pressure sodium lamp in which the tube produced was used operated with a luminous efficiency of 105 lm/W but after a 911-h period in service the lamp failed due to a crack in the tube.

EXAMPLE 2.

A sapphire tube was pulled under the conditions of a longitudinal temperature gradient of 28 deg. C./cm in the wall, using an apparatus wherein the shields were provided with perforations enabling the convective gas flows to pass. The tube so grown was annealed by being heated to 1970 deg. C. at a rate of 40 deg. C./min, kept at this temperature for 3 hours and then cooled to room temperature at a rate of 40 deg. C./min. The integrated light transmission of the sapphire tube so produced amounted to 91 percent. During a performance test, a high-pressure sodium lamp in which the tube produced was used operated with a luminous efficiency of 120 lm/W and at the end of the 3500-hour test run the lamp showed no mechanical defects.

The above examples give good reasons to conclude that the observing of the temperatures recommended in pulling sapphire tubes is conducive to improved illuminating and mechanical properties of the tubes.

While a preferred embodiment of a method and apparatus for producing sapphire tubes has been described in the foregoing description, it will be understood that various modifications and improvements within the spirit of the present invention as defined by the claims that follow may occur to those skilled in the art.

What is claimed is:

1. A method for producing a crystalline sapphire tube comprising melting a material for producing said tube, pulling a tube from said melt using a seed through a die under an inert-gas blanket, maintaining a longitudinal temperature gradient of not more than 30° C./cm in the wall of said tube within a zone between a solidified front of said tube and a pulling region wherein the temperature is 1850 to 1900° C., annealing said tube at a temperature between 1950 and 2000° C. by heating said tube at a rate of 30 to 40° C./min, and cooling said annealed tube at a rate of 30° to 40° C./min.

2. A method as claimed in claim 1 wherein the annealing lasts between 3 and 4 hours.

3. The method of claim 1 in which said tube is annelaed for between 3 and 4 hours.

4. The method of claim 1 in which said tube is cooled to room temperature.

5. The method of claim 1 in which said temperature gradient is 10° to 20° C./cm.

6. The method of claim 1, wherein a longitudinal temperature gradient of not more than 30° C./cm in the wall of said tube within fthe zone between a solidified front of said tube and a pulling region wherein the temperature is 1850° to 1900° C. is provided by heat-insulating shields and pins mad of heat conducting material.

7. A method for producing a crystalline sapphire tube comprising melting aluminum oxide by means of induction heating in an air-tight chamber, pulling a tube from said melt using a seed through a die under an inert-gas blanket and an excess pressure between 0.1 to 0.3 atm. gauge, maintaining a longitudinal temperature gradient of 10° to 20° C./cm in the wall of said tube within a zone between a solidified front and a pulling region wherein the temperature is 1850° to 1900° C., said temperature gradient being maintained at least partially by regulating convective gas flow upstream of said die in said pulling region, annealing said tube at a temperature between 1950° and 2000° C. by heating said tube at a rate of 30° to 40° C./min for between 3 and 4 hours, and cooling said annealed tube to room temperature at a rate of 30° to 40° C./cm.

8. A method according to claim 7 wherein the longitudinal temperature gradient of 10° to 20° C. per centimeter in the wall of said tube within a zone between a solidified front and a pulling region wherein the temperature is 1850° to 1900° C. is provided by heat-insulating shields and pins made of heat conducting material.

9. A method according to claim 8 wherein the regulation of the convective gas flow upstream of said die and said pulling region is provide by perforations in the heat insulating shields.

* * * * *